(12) United States Patent
Du et al.

(10) Patent No.: US 12,266,281 B2
(45) Date of Patent: Apr. 1, 2025

(54) DISPLAY SUBSTRATE AND DISPLAY DEVICE

(71) Applicants: CHENGDU BOE OPTOELECTRONICS TECHNOLOGY CO., LTD., Sichuan (CN); BOE Technology Group Co., Ltd., Beijing (CN)

(72) Inventors: Lili Du, Beijing (CN); Hongjun Zhou, Beijing (CN); Feng Wei, Beijing (CN)

(73) Assignees: CHENGDU BOE OPTOELECTRONICS TECHNOLOGY CO., LTD., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/782,164

(22) PCT Filed: Jun. 1, 2021

(86) PCT No.: PCT/CN2021/097632
§ 371 (c)(1),
(2) Date: Jun. 2, 2022

(87) PCT Pub. No.: WO2022/252112
PCT Pub. Date: Dec. 8, 2022

(65) Prior Publication Data
US 2024/0194101 A1    Jun. 13, 2024

(51) Int. Cl.
*G09G 3/00* (2006.01)
*H10K 59/127* (2023.01)
*H10K 59/131* (2023.01)

(52) U.S. Cl.
CPC ......... *G09G 3/006* (2013.01); *H10K 59/1275* (2023.02); *H10K 59/131* (2023.02); *G09G 2300/0426* (2013.01)

(58) Field of Classification Search
None
See application file for complete search history.

(56) References Cited

U.S. PATENT DOCUMENTS

2006/0001792 A1    1/2006   Choi
2013/0092418 A1    4/2013   Shih et al.
(Continued)

FOREIGN PATENT DOCUMENTS

CN    1722452 A     1/2006
CN    107154232 A   9/2017
(Continued)

OTHER PUBLICATIONS

Partial Supplementary European Search Report in the European Patent Application No. 21943484.2, dated Nov. 27, 2023.
(Continued)

*Primary Examiner* — Joseph R Haley
(74) *Attorney, Agent, or Firm* — Intellectual Valley Law, P.C.

(57) ABSTRACT

A display substrate and a display device are provided. The display substrate includes a display region and a non-display region at least partially surrounding the display region and including a binding region. A plurality of first pads are located in the binding region, and configured to be electrically coupled to an external electrical test circuitry at a panel test stage, and bound to a circuit board so as to transmit an electric signal from the circuit board to the display region at a display stage. A plurality of second pads are located in the binding region, and configured to be bound to the circuit board so as to transmit the electric signal from the circuit board to the display region at the display stage.

19 Claims, 5 Drawing Sheets

(56) References Cited

U.S. PATENT DOCUMENTS

| | | |
|---|---|---|
| 2013/0093658 A1 | 4/2013 | Park et al. |
| 2014/0139509 A1* | 5/2014 | Kim ..................... G09G 3/3688 |
| | | 345/82 |
| 2018/0151100 A1 | 5/2018 | Zhou |
| 2019/0115400 A1 | 4/2019 | Park et al. |
| 2020/0050068 A1 | 2/2020 | Park et al. |
| 2020/0203235 A1* | 6/2020 | Jung ..................... H01L 22/32 |
| 2020/0214128 A1 | 7/2020 | Wu et al. |
| 2021/0181559 A1 | 6/2021 | Li et al. |
| 2022/0085261 A1* | 3/2022 | Min ..................... H01L 27/156 |

FOREIGN PATENT DOCUMENTS

| | | |
|---|---|---|
| CN | 108615493 A | 10/2018 |
| CN | 109001945 A | 12/2018 |
| CN | 110289225 A | 9/2019 |
| CN | 110910758 A | 3/2020 |
| CN | 111524450 A | 8/2020 |
| CN | 111681545 A | 9/2020 |
| KR | 20140098937 A | 8/2014 |
| KR | 20160084746 A | 7/2016 |

OTHER PUBLICATIONS

Extended European Search Report in the European Patent Application No. 21943484.2, dated Mar. 25, 2024.

* cited by examiner

DISPLAY SUBSTRATE AND DISPLAY DEVICE

CROSS-REFERENCE TO RELATED APPLICATION

This application is a national stage application under 35 U.S.C. § 371 of International Application No. PCT/CN2021/097632, filed Jun. 1, 2021, the contents of which are incorporated by reference in the entirety.

TECHNICAL FIELD

The present disclosure relates to the field of display technology, in particular to a display substrate and a display device.

BACKGROUND

Organic Light-Emitting Diode (OLED) display device has become a promising next-generation display technology due to such advantages as being light and thin, a wide viewing angle, self-luminescence, adjustable color, low cost, rapid response, low power consumption, a low driving voltage, a wide operating temperature range, a simple manufacture process, high luminous efficiency and being flexible, and it has been widely used in various field such as television, smart phone, smart wearable device, Virtual Reality (VR) and vehicle.

Along with the development of the OLED display product, "screen-to-body ratio" has become a hot word about an appearance of an OLED smart product such as smart phone and smart wearable device. However, a size of the product cannot increase infinitely, and a bezel of a display panel is reduced so as to obtain a higher screen-to-body ratio. Hence, in order to meet the user's requirement on portability and viewing angle, there is a new trend to provide an OLED display product with an extremely narrow bezel or provide a bezel-free OLED display product.

SUMMARY

In one aspect, the present disclosure provides in some embodiments a display substrate, including: a display region and a non-display region at least partially surrounding the display region, the non-display region including a binding region: a plurality of first pads located in the binding region, and configured to be electrically coupled to an external electrical test circuitry at a panel test stage, and bound to a circuit board so as to transmit an electric signal from the circuit board to the display region at a display stage: and a plurality of second pads located in the binding region, and configured to be bound to the circuit board so as to transmit the electric signal from the circuit board to the display region at the display stage. The plurality of first pads and the plurality of second pads are arranged side by side in a first direction, and a width of each of the plurality of first pads in the first direction is greater than a width of each of at least a part of the plurality of second pads in the first direction.

In a possible embodiment of the present disclosure, a distance between two adjacent first pads is greater than a distance between two adjacent second pads of at least a part of the second pads in the first direction, and the display region and the binding region are arranged sequentially in a second direction intersecting the first direction.

In a possible embodiment of the present disclosure, an extension direction of the plurality of first pads and the plurality of second pads is substantially parallel to the second direction.

In a possible embodiment of the present disclosure, an orthogonal projection of each of the plurality of first pads and the plurality of second pads onto the display substrate is of a rectangular shape.

In a possible embodiment of the present disclosure, a length of each first pad is greater than a length of each of at least a part of the second pads in the second direction.

In a possible embodiment of the present disclosure, the plurality of first pads includes a first sub-pad group and a second sub-pad group, the first sub-pad group includes a plurality of first sub-pads, the second sub-pad group includes a plurality of second sub-pads, and the plurality of second pads is located between the first sub-pad group and the second sub-pad group.

In a possible embodiment of the present disclosure, the plurality of second pads includes a third sub-pad group, a fourth sub-pad group and a fifth sub-pad group, the third sub-pad group includes a plurality of third sub-pads, the fourth sub-pad group includes a plurality of fourth sub-pad, the fifth sub-pad group includes a plurality of fifth sub-pads, and the fifth sub-pad group is located between the third sub-pad group and the fourth sub-pad group, or the third sub-pad group and the fourth sub-pad group are located between the fifth sub-pads.

In a possible embodiment of the present disclosure, a width of each of the plurality of third sub-pads and the plurality of fourth sub-pads is greater than a width of each of at least a part of the fifth sub-pads in the first direction.

In a possible embodiment of the present disclosure, the plurality of third sub-pads and the plurality of fourth sub-pads are configured to be electrically coupled to the external electrical test circuitry at the panel test stage, and bound to the circuit board so as to transmit the electric signal from the circuit board to the display region at the display stage.

In a possible embodiment of the present disclosure, the display region includes a first boundary, a second boundary, a third boundary and a fourth boundary arranged in sequence, and the binding region is located at the non-display region close to the fourth boundary. The display substrate further includes a first power source line (VDD), a first power source pin and a second power source pin, the first power source line is coupled to the first power source pin and the second power source pin, the first power source line extends along the first direction and is located at the non-display region between the display region and the binding region, the first power source pin is located at a side of the plurality of first sub-pads away from the plurality of second pads, and the second power source pin is located at a side of the plurality of second sub-pads away from the plurality of first sub-pads.

In a possible embodiment of the present disclosure, the display substrate further includes a second power source line (VSS), a third power source pin and a fourth power source pin, the second power source line is coupled to the third power source pin and the fourth power source pin, the second power source line is located at the non-display region and at least partially surrounds the first boundary, the second boundary and the third boundary, the third power source pin and the fourth power source pin are located at the non-display region close to the fourth boundary, the third power source pin is located at a side of the first power source pin away from the plurality of second pads, and the fourth power source pin is located at a side of the third power source pin away from the plurality of second pads.

In a possible embodiment of the present disclosure, the first power source pin, the second power source pin, the third power source pin, and the fourth power source pin are configured to be electrically coupled to the external electrical test circuitry at the panel test stage, and bound to the circuit board so as to transmit the electric signal from the circuit board to the display region at the display stage.

In a possible embodiment of the present disclosure, the plurality of first sub-pads is located between the first power source pin and the third power source pin, and the plurality of second sub-pads is located between the second power source pin and the fourth power source pin.

In a possible embodiment of the present disclosure, the plurality of first sub-pads is located at a side of the third power source pin away from the first power source pin, and the plurality of second sub-pads is located at a side of the fourth power source pin away from the second power source pin.

In a possible embodiment of the present disclosure, the first power source line is a positive voltage power source line and the second power source line is a negative voltage power source line.

In a possible embodiment of the present disclosure, a width of at least one of the first power source pin, the second power source pin, the third power source pin and the fourth power source pin is greater than the width of the plurality of first pads or the plurality of second pads in the first direction.

In a possible embodiment of the present disclosure, the first pad is configured to transmit at least one of a gate driving signal, a multiplexer signal and an electric test signal.

In a possible embodiment of the present disclosure, the third sub-pad and the fourth sub-pad are configured to transmit a high level signal and a low level signal respectively, and the fifth sub-pad is configured to transmit a data signal.

In a possible embodiment of the present disclosure, the display substrate further includes a plurality of input pins and a plurality of output pins located between the display region and the plurality of second pads, the plurality of input pins is located at a side of the plurality of output pins away from the display region, the plurality of input pins and the plurality of output pins are configured to be bound to a driver integrated circuit, and the plurality of input pins is coupled to the plurality of second pads through wires.

The present disclosure further provides in some embodiments a display device, including the above-mentioned display substrate and a circuit board. The plurality of first pads and the plurality of second pads are bound to the circuit board.

DETAILED DESCRIPTION

In order to make the objects, the technical solutions and the advantages of the present disclosure more apparent, the present disclosure will be described hereinafter in a clear and complete manner in conjunction with the drawings and embodiments.

Figure 1:
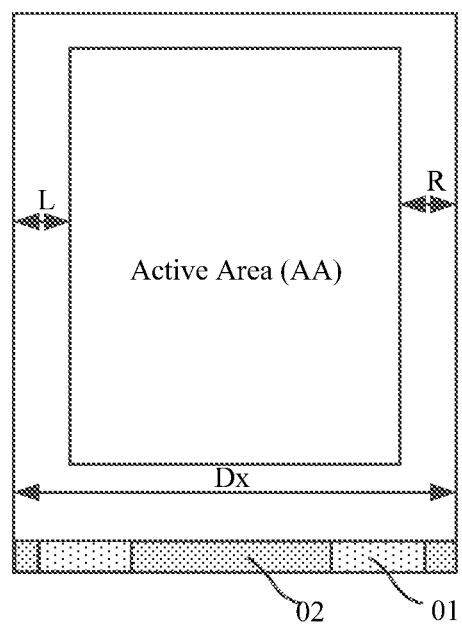
FIG. 1 is a schematic view showing an appearance of an OLED display product.

During the manufacturing of a display substrate, before it is bound to the circuit board, generally an electrical test needs to be performed to detect whether there are such defects as foreign matters, mura, bright spots and dark spots, so as to ensure an accurate wiring arrangement and an excellent display function of the display substrate. As shown in FIG. 1, an electrical test pad region 01 is provided on the display substrate, and a probe of an electrical test circuitry is coupled to the electrical test pad at the electrical test pad region 01 to perform the electrical test. In addition, as shown in FIG. 1, a circuit board pad region 02 is further provided on the display substrate, and it includes a plurality of circuit board pads to be bound to a driving circuit board.

A width Dx of a lower bezel of the display substrate is closely related to a width of a left bezel (L) and a right bezel (R) of the display substrate. As shown in FIG. 1, the circuit board pad region 02 and the electrical test pad region 01 are arranged at the lower bezel of the display substrate, so the width Dx of the lower bezel of the display substrate is relatively large. Due to the larger width Dx, the width of the lower bezel the left and right bezels may increase. Especially for a small-size display product, when an area of the circuit board pad region 02 and the electrical test pad region 01 is too large, the width Dx of the lower bezel of the display substrate is far greater than a width of the display region, and thereby the width of the left and right bezels may increase. At this time, a screen-to-body ratio of the display region will be reduced.

An object the present disclosure is to provide a display substrate and display device, so as to increase the screen-to-body ratio of the display region.

The present disclosure provides in some embodiments a display substrate, which includes: a display region and a non-display region at least partially surrounding the display region, the non-display region including a binding region: a plurality of first pads located in the binding region, and configured to be electrically coupled to an external electrical test circuitry at a panel test stage, and bound to a circuit board so as to transmit an electric signal from the circuit board to the display region at a display stage: and a plurality of second pads located in the binding region, and configured to be bound to the circuit board so as to transmit the electric signal from the circuit board to the display region at the display stage. The plurality of first pads and the plurality of second pads are arranged side by side in a first direction, and a width of each of the plurality of first pads in the first direction is greater than a width of each of at least a part of the plurality of second pads in the first direction.

According to the embodiments of the present disclosure, the first pad is electrically coupled to the external electrical test circuitry at the panel test state, and further bound to the circuit board to transmit the electric signal from the circuit board to the display region, i.e., the first pad functions as both the electric test pad and the circuit board pad, so it is unnecessary to provide a specific region for the electric test pad. As a result, it is able to reduce a total area of the circuit board pad region 02 and the electrical test pad region 01, and reduce the width Dx of the lower bezel of the display substrate as well as the width of the left and right bezels of the display substrate, thereby to increase the screen-to-body ratio of the display region and provide a narrow bezel.

At the panel test stage, the external electrical test circuitry is electrically coupled to the first pad, so as to perform the electrical test to detect whether there are such defects as foreign matters, mura, bright spots and dark sports in the display substrate, thereby to ensure an accurate wiring arrangement and an excellent display function of the display substrate. After the electric test, a driving circuit board is bound to the first pads and the second pads. At the display stage, the circuit board transmits the electric signal to the display region through the first pads and the second pads, so as to achieve the display function at the display region. Each first pad has two boundaries substantially perpendicular to the first direction, and a shortest distance between the two boundaries is just a width of the first pad in the first direction. Each second pad has two boundaries substantially perpendicular to the first direction, and a shortest distance between the two boundaries is just a width of the second pad in the first direction.

In the embodiments of the present disclosure, as shown in FIGS. 3 to 6, the first pad 031 in the circuit board pad also serves as an electrical test pad. During the electrical test, the first pad 031 needs to be coupled to the probe of the electrical test circuitry. Due to the large-size probe, the width of the first pad 031 should be greater than the width of at least part of the second pads 032 in the first direction, so as to ensure that the first pad 031 is electrically coupled to the probe of the electrical test circuitry.

In addition, a distance between the adjacent first pads 031 also needs to be large so as to prevent the occurrence of a short circuit between the adjacent probes during the electrical test. The second pad 032 is used to input the electric signal to the display region, and a distance between the adjacent second pads 032 may be small so as to reduce an area occupied by the circuit board pad. Hence, the distance between two adjacent first pads is greater than the distance between two adjacent second pads of at least a part of the second pads in the first direction, and the display region and the binding region are arranged sequentially in a second direction intersecting the first direction.

In some embodiments of the present disclosure, an extension direction of the plurality of first pads 031 and the plurality of second pads 032 is substantially parallel to the second direction. In the embodiments of the present disclosure, an arrangement mode of the display region and non-display region is the same as that in the related art. The non-display region includes the binding region located at the lower bezel of the display substrate, a circuitry unit located at the upper half of each of the left and right bezels of the display substrate, and a clock multiplexing circuitry and a fan-out region located at a lower half of each of the left and right bezels. Through merely adjusting the distance between a part of the circuit board pads and/or a size of a part of the circuit board pads in the binding region, it is able for a part of the circuit board pads to serve as the electrical test pads, so it is able to reduce the manufacture cost for the subsequent promotion.

Figure 2:
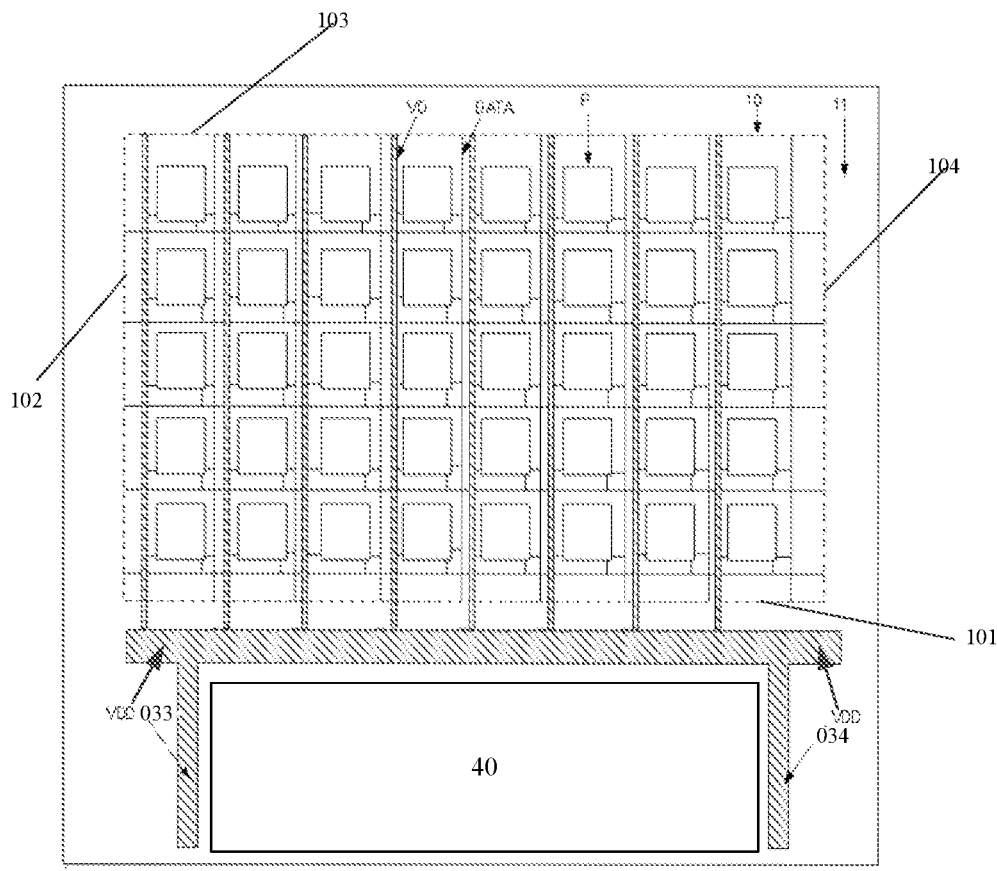
FIG. 2 is a schematic view showing a display substrate according to one embodiment of the present disclosure.

As shown in FIG. 2, the display substrate includes a base substrate, and the base substrate includes a display region 10 and a non-display region 11 surrounding the display region 10.

A plurality of sub-pixels P, a plurality of data lines DATA, and a plurality of gate lines are arranged at the display region 10. The display substrate further includes a plurality of first power source lines VD located at the display region 10 and a first power source bus VDD located at the non-display region 11 close to a first boundary (a lower boundary) of the display region 10, and the plurality of first power source lines VD is electrically coupled to the first power source bus VDD. At the display region 10, the sub-pixels P in each column are electrically coupled to one first power source line VD, and the plurality of first power source lines VD electrically coupled to the sub-pixels P in columns are extracted from the display region 10 so as to be coupled to the first power source bus VDD at the non-display region 11.

The display region 10 includes a first boundary 101 (a lower boundary), a second boundary 102 (a left boundary), a third boundary 103 (an upper boundary) and a fourth boundary 104 (a right boundary) connected in an end-to-end manner, and the binding region 40 is located at the non-display region 11 adjacent to the first boundary of the display region 10. In the embodiments of the present disclosure, the quantity of first pads depends on the test requirement, i.e., the quantity of first pads needs to be set so as to meet the test requirement. A total quantity of circuit board pads depends on a resolution of the display substrate and a property of the driving circuit board. Hence, in the embodiments of the present disclosure, before the manufacture of the display substrate, the total quantity of circuit board pads is determined in accordance with the resolution of the display substrate and the property of the driving circuit board, then the quantity of first pads is determined in accordance with the test requirement, and then the quantity of second pads is determined in accordance with the total quantity of circuit board pads and the quantity of first pads. Then, the distance between the first pads and the distance between the second pads are determined in accordance with a space defined by the lower bezel of the display substrate and the process condition, so as to enable the distance between the first pads to meet the requirement on the electrical test, and enable the distance between the second pads to meet the requirement on the application of the electric signal. In this way, during the electrical test, the first pad serves as the electrical test pad, and after the display substrate is bound to the driving circuit board, the first pad and the second pad together serve as the circuit board pad to transmit the electric signal from the driving circuit board to the display region.

In a possible embodiment of the present disclosure, the quantity of the first pads is 10-50, e.g., 21, and the width of the first pad in the first direction is 50 μm to 500 μm. When the VDD signal line is coupled to the VSS signal line through the first pad, the width of the first pad in the first direction is 50 μm to 500 μm, e.g., 280 μm. When the first pad is coupled to the other signal line, the width of the first pad in the first direction is 20 μm to 200 μm, e.g., 90 μm.

The quantity of the second pads is 20-1000, e.g., 104, and the width of the second pad in the first direction is 10 μm to 100 μm, e.g., 57 μm.

The first pad is coupled to the electrical test circuitry for the display substrate through a wiring, and then the electrical test circuitry is coupled to the signal line at an Active Area (AA) (the display region), so as to detect whether an image is displayed by the display substrate normally. The second pad is coupled to an IC pin (a pin of the driving circuit board) at an input end of the display substrate through a wiring, so as to transmit the signal to the IC bound to the display substrate, and then transmit the signal to the data line at the display region through the IC PIN at an output end so as to display a corresponding image. During the electrical test, merely the probe is lapped onto the first pad for the test, and there is no damage on the first pad. After the test, the first pad is bound to a Flexible Printed Circuit (FPC).

It should be appreciated that, the display substrate here refers to a display substrate to which no driving circuit board is bound to the binding region. Before the binding, the display substrate is detected through the external electrical test circuitry and the first pad, so as to determine whether the display substrate is abnormal. When the display substrate is normal, the circuit board is bound to the display substrate. In this way, it is able to improve the yield of the display substrate.

In some embodiments of the present disclosure, each first pad has two boundaries substantially perpendicular to the second direction, and a shortest distance between the two boundaries is just a length of the first pad in the second direction. Each second pad has two boundaries substantially perpendicular to the second direction, and a shortest distance between the two boundaries is just a length of the second pad in the second direction.

An orthogonal projection of each of the plurality of first pads 031 and the plurality of second pads 032 onto the display substrate is of a rectangular shape, so as to match the probe of the external electrical test circuitry and the pin of the circuit board. When the orthogonal projection is of a rectangular shape, it means that the width of the first pad in the first direction is smaller than the length of the first pad in the second direction, and the width of the second pad in the first direction is smaller than the length of the second pad in the second direction.

Due to the large-size probe, in some embodiments of the present disclosure, the length of each first pad 031 is greater than the length of each of at least a part of the second pads 032 in the second direction, so as to ensure that the first pad 031 is electrically coupled to the probe.

Figure 3:
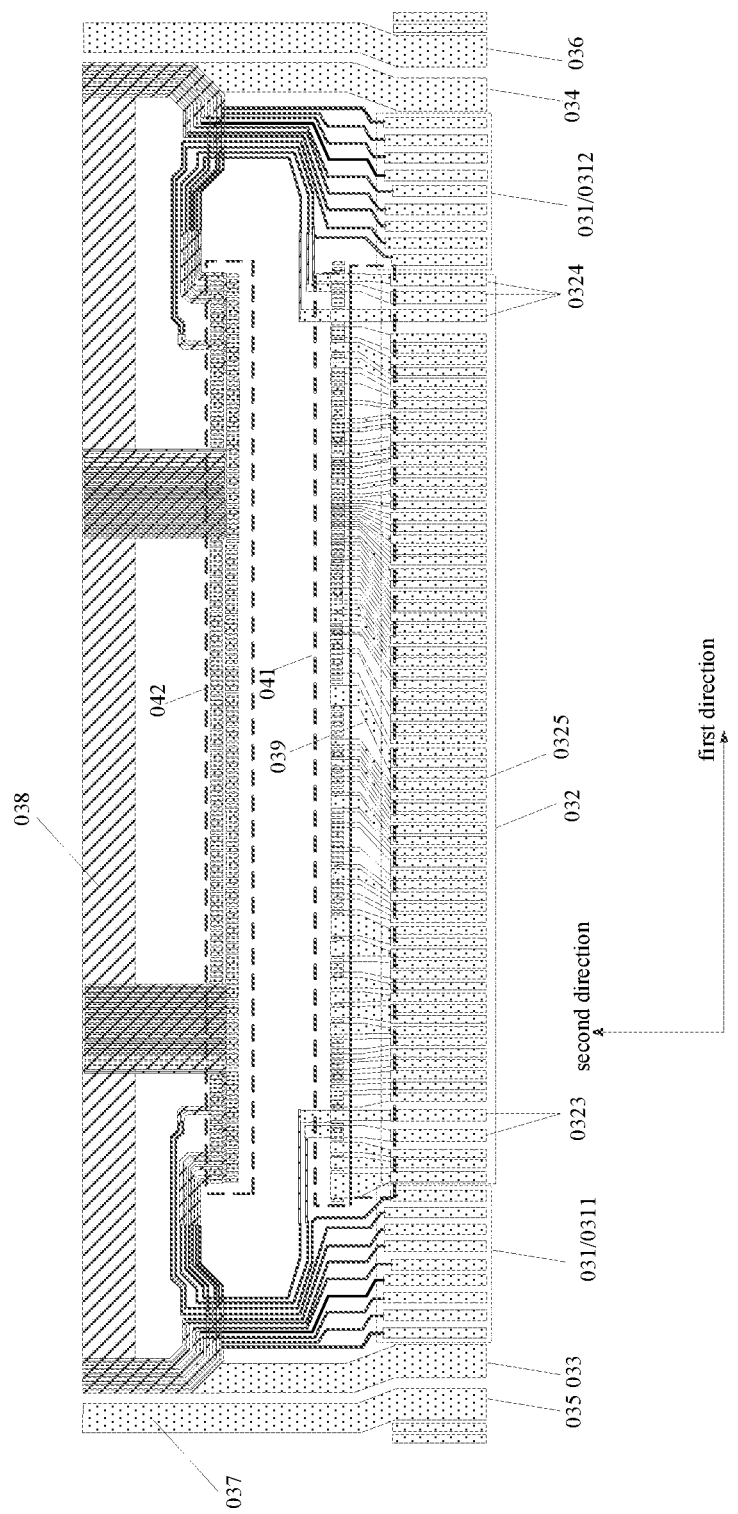
FIGS. 3 to 6 are schematic views showing a binding region according to one embodiment of the present disclosure.

In some embodiments of the present disclosure, as shown in FIG. 3, the plurality of first pads 031 includes a first sub-pad group and a second sub-pad group, the first sub-pad group includes a plurality of first sub-pads 0311, the second sub-pad group includes a plurality of second sub-pads 0312, and the plurality of second pads 032 is located between the first sub-pad group and the second sub-pad group.

In some embodiments of the present disclosure, as shown in FIGS. 3 to 6, the plurality of second pads 032 includes a third sub-pad group, a fourth sub-pad group and a fifth sub-pad group, the third sub-pad group includes a plurality of third sub-pads 0323, the fourth sub-pad group includes a plurality of fourth sub-pads 0324, and the fifth sub-pad group includes a plurality of fifth sub-pads 0325.

A part of or all of the fifth sub-pad group are located between the third sub-pad group and the fourth sub-pad group, or the third sub-pad group and the fourth sub-pad group are located between the fifth sub-pads.

Figure 6:
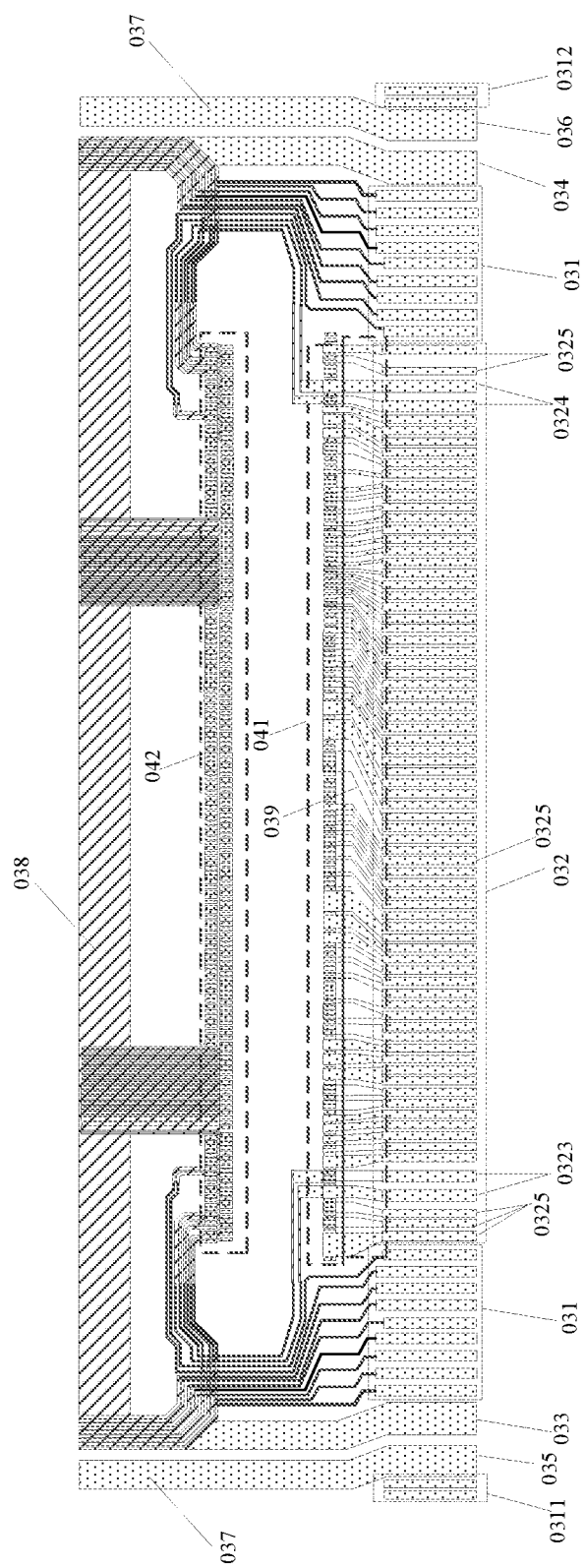

As shown in FIG. 6, all of the third sub-pads and the fourth sub-pads are located between the fifth sub-pads, or a part of the third sub-pads are located between the fifth sub-pads, or a part of the fourth sub-pads are located between the fifth sub-pads, or all the third sub-pads and the fourth sub-pads are not located between the fifth sub-pads.

In a possible embodiment of the present disclosure, as shown in FIG. 3, the third sub-pad group is located between the fifth sub-pads, but the fourth sub-pad group is not located between the fifth sub-pads.

Figure 4:
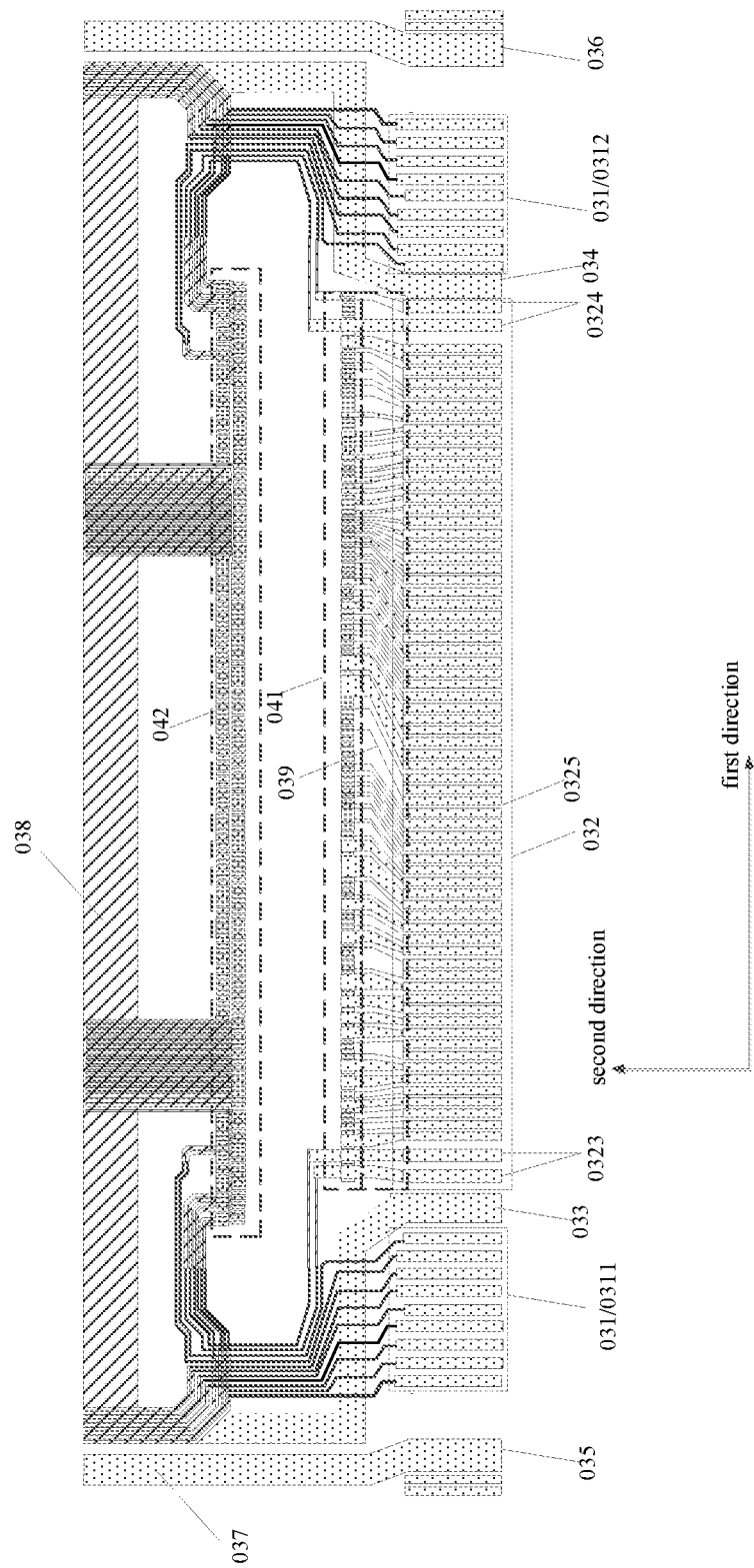
Figure 5:
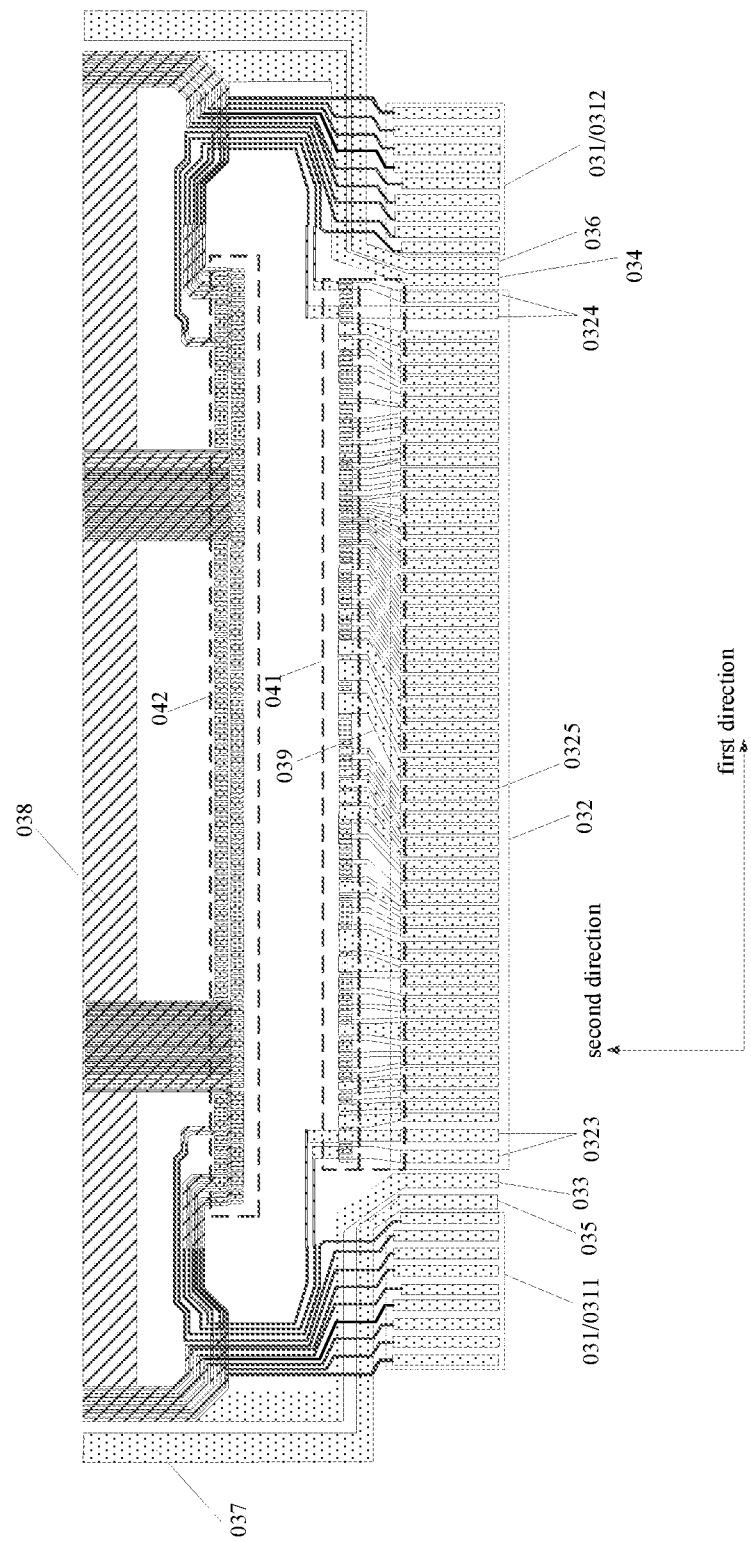

In another possible embodiment of the present disclosure, as shown in FIGS. 4 and 5, the third sub-pad group and the fourth sub-pad group are not located between the fifth sub-pads.

In some embodiments of the present disclosure, a width of each of the plurality of third sub-pads 0323 and the plurality of fourth sub-pads 0324 is greater than a width of at least a part of the fifth sub-pads 0325 in the first direction.

In some embodiments of the present disclosure, the widths of the third sub-pads 0323 and the fourth sub-pads 0324 in the first direction are relatively large to be electrically coupled to the probe, so the plurality of third sub-pads 0323 and the plurality of fourth sub-pads 0324 are configured to be electrically coupled to the external electrical test circuitry at the panel test stage, and bound to the circuit board so as to transmit the electric signal from the circuit board to the display region at the display stage.

In some embodiments of the present disclosure, the display region includes a first boundary, a second boundary, a third boundary and a fourth boundary arranged in sequence, and the binding region is located at the non-display region close to the fourth boundary.

As shown in FIG. 3, the display substrate further includes a first power source line 038 (VDD), a first power source pin 033 and a second power source pin 034, the first power source line 038 is coupled to the first power source pin 033 and the second power source pin 034, the first power source line 038 extends along the first direction and is located at the non-display region between the display region and the binding region, the first power source pin 033 is located at a side of the plurality of first sub-pads 0311 away from the plurality of second pads 032, and the second power source pin 034 is located at a side of the plurality of second sub-pads 0312 away from the plurality of first sub-pads.

In some embodiments of the present disclosure, as shown in FIG. 3, the display substrate further includes a second power source line 037 (VSS), a third power source pin 035 and a fourth power source pin 036, and the second power source line 037 is coupled to the third power source pin 035 and the fourth power source pin 036. The second power source line 037 is located at the non-display region and at least partially surrounds the first boundary, the second boundary and the third boundary, the third power source pin 035 and the fourth power source pin 036 are located at the non-display region close to the fourth boundary. The third power source pin 035 is located at a side of the first power source pin 033 away from the plurality of second pads 032, and the fourth power source pin 036 is located at a side of the third power source pin 034 away from the plurality of second pads 032.

In some embodiments of the present disclosure, the first power source pin 033, the second power source pin 034, the third power source pin 035, and the fourth power source pin 036 are configured to be electrically coupled to the external electrical test circuitry at the panel test stage, and bound to the circuit board so as to transmit the electric signal from the circuit board to the display region at the display stage. In this way, In some embodiments of the present disclosure, as shown in FIG. 4, the plurality of first sub-pads 0311 is located between the first power source pin 033 and the third power source pin 035, and the plurality of second sub-pads 0312 is located between the second power source pin 034 and the fourth power source pin 036.

In some embodiments of the present disclosure, as shown in FIG. 5, the plurality of first sub-pads 0311 is located at a side of the third power source pin 035 away from the first power source pin 033, and the plurality of second sub-pads 0312 is located at a side of the fourth power source pin 036 away from the second power source pin 034.

In the embodiments of the present disclosure, the first power source line 038 is a positive voltage power source line, and the second power source line 037 is a negative voltage power source line.

In some embodiments of the present disclosure, in order to ensure the reliable electrical connection, a width of at least one of the first power source pin 033, the second power source pin 034, the third power source pin 035 and the fourth power source pin 036 is greater than the width of the plurality of first pads or the plurality of second pads in the first direction.

In some embodiments of the present disclosure, the first pad 031 is configured to transmit at least one of a gate driving signal, a multiplexer signal and an electric test signal.

In some embodiments of the present disclosure, the third sub-pad 0323 and the fourth sub-pad 0324 are configured to transmit a high level signal and a low level signal respectively, and the fifth sub-pad 0325 is configured to transmit a data signal.

In some embodiments of the present disclosure, as shown in FIG. 3, the first pads 031 are arranged symmetrically at two ends of the binding region. During the electrical test, the electrical test signal is applied to the display region at both sides in the first direction through the first pads, so the first pads are arranged at the two ends of the binding region so as to facilitate the wiring.

After the display substrate has been manufactured and before it is bound to the driving circuit board, the display substrate merely includes input pins and output pints to be bound to the driving circuit board. In some embodiments of the present disclosure, as shown in FIGS. 4 to 6, the display substrate further includes a plurality of input pins 041 and a plurality of output pins 042 located between the display region and the plurality of second pads 032, and the plurality of input pins 041 is located at a side of the plurality of output pins 042 away from the display region. The plurality of input pins 041 and the plurality of output pins 042 are configured to be bound to a driver IC, and the plurality of input pins 041 is coupled to the plurality of second pads 032 through wires 039.

The present disclosure further provides in some embodiments a display device which includes the above-mentioned display substrate, and a circuit board to which the plurality of first pads and the plurality of second pads are bound.

T The display device may include, but not limited to, a radio frequency unit, a network module, an audio output unit, an input unit, a sensor, a display unit, a user input unit, an interface unit, a memory, a processor, and a power source. It should be appreciated that, the display device may not be limited thereto, i.e., it may include more or fewer members, or some members may be combined, or the members may be arranged in different modes. In the embodiments of the present disclosure, the display device may include, but not limited to, display, mobile phone, flat-panel computer, television, wearable electronic device or navigator.

The display device be any product or member having a display function, such as television, display, digital photo frame, mobile phone or tablet computer. The display device further includes a flexible circuit board, a printed circuit board and a back plate.

The present disclosure further provides in some embodiments a method for manufacturing a display substrate. The display substrate includes a display region and a non-display region at least partially surrounding the display region and including a binding region. The method includes: forming a plurality of first pads in the binding region, the plurality of first pads being configured to be electrically coupled to an external electrical test circuitry at a panel test stage, and bound to a circuit board so as to transmit an electric signal from the circuit board to the display region at a display stage: and forming a plurality of second pads in the binding region, the plurality of second pads being configured to be bound to the circuit board so as to transmit the electric signal from the circuit board to the display region at the display stage. The plurality of first pads and the plurality of second pads are arranged side by side in a first direction, and a width each first pad in the first direction is greater than a width of each of at least a part of the plurality of second pads in the first direction.

According to the embodiments of the present disclosure, the first pad is electrically coupled to the external electrical test circuitry at the panel test state, and further bound to the circuit board to transmit the electric signal from the circuit board to the display region, i.e., the first pad functions as both the electric test pad and the circuit board pad, so it is unnecessary to provide a specific region for the electric test pad. As a result, it is able to reduce a total area of the circuit board pad region 02 and the electrical test pad region 01, and reduce the width Dx of the lower bezel of the display substrate as well as the width of the left and right bezels of the display substrate, thereby to increase the screen-to-body ratio of the display region and provide a narrow bezel.

At the panel test stage, the external electrical test circuitry is electrically coupled to the first pad, so as to perform the electrical test to detect whether there are such defects as foreign matters, mura, bright spots and dark sports in the display substrate, thereby to ensure an accurate wiring arrangement and an excellent display function of the display substrate. After the electric test, a driving circuit board is bound to the first pads and the second pads. At the display stage, the circuit board transmits the electric signal to the display region through the first pads and the second pads, so as to achieve the display function at the display region.

Each first pad has two boundaries substantially perpendicular to the first direction, and a shortest distance between the two boundaries is just a width of the first pad in the first direction. Each second pad has two boundaries substantially perpendicular to the first direction, and a shortest distance between the two boundaries is just a width of the second pad in the first direction.

In the embodiments of the present disclosure, as shown in FIGS. 3 to 6, the first pad 031 in the circuit board pad also serves as an electrical test pad. During the electrical test, the first pad 031 needs to be coupled to the probe of the electrical test circuitry. Due to the large-size probe, the width of the first pad 031 should be greater than the width of at least part of the second pads 032 in the first direction, so as to ensure that the first pad 031 is electrically coupled to the probe of the electrical test circuitry.

In addition, a distance between the adjacent first pads 031 also needs to be large so as to prevent the occurrence of a short circuit between the adjacent probes during the electrical test. The second pad 032 is used to input the electric signal to the display region, and a distance between the adjacent second pads 032 may be small so as to reduce an area occupied by the circuit board pad. Hence, the distance between two adjacent first pads is greater than the distance between two adjacent second pads of at least a part of the second pads in the first direction, and the display region and the binding region are arranged sequentially in a second direction intersecting the first direction.

In some embodiments of the present disclosure, an extension direction of the plurality of first pads 031 and the plurality of second pads 032 is substantially parallel to the second direction.

In the embodiments of the present disclosure, an arrangement mode of the display region and non-display region is the same as that in the related art. The non-display region includes the binding region located at the lower bezel of the display substrate, a circuitry unit located at the upper half of each of the left and right bezels of the display substrate, and a clock multiplexing circuitry and a fan-out region located at a lower half of each of the left and right bezels. Through merely adjusting the distance between a part of the circuit board pads and/or a size of a part of the circuit board pads in the binding region, it is able for a part of the circuit board pads to serve as the electrical test pads, so it is able to reduce the manufacture cost for the subsequent promotion.

In some embodiments of the present disclosure, the forming the plurality of first pads and the plurality of second pads includes determining the quantity of first pads coupled to the external electrical test circuitry and a size of each first pad, forming the first pads in the binding region in accordance with the quantity and the size, and forming the second pads in the binding region in accordance with a size of the circuit board pad. A sum of the quantity of the second pads and the quantity of the first pads is equal to the quantity of the circuit board pads.

In the embodiments of the present disclosure, the quantity of first pads depends on the test requirement, i.e., the quantity of first pads needs to be set so as to meet the test requirement. A total quantity of circuit board pads depends on a resolution of the display substrate and a property of the driving circuit board. Hence, in the embodiments of the present disclosure, before the manufacture of the display substrate, the total quantity of circuit board pads is determined in accordance with the resolution of the display substrate and the property of the driving circuit board, then the quantity of first pads is determined in accordance with the test requirement, and then the quantity of second pads is determined in accordance with the total quantity of circuit board pads and the quantity of first pads. Then, the distance between the first pads and the distance between the second pads are determined in accordance with a space defined by the lower bezel of the display substrate and the process condition, so as to enable the distance between the first pads to meet the requirement on the electrical test, and enable the distance between the second pads to meet the requirement on the application of the electric signal. In this way, during the electrical test, the first pad serves as the electrical test pad, and after the display substrate is bound to the driving circuit board, the first pad and the second pad together serve as the circuit board pad to transmit the electric signal from the driving circuit board to the display region.

In a possible embodiment of the present disclosure, the quantity of the first pads is 10-50, e.g., 21, and the width of the first pad in the first direction is 50 µm to 500 µm. When the VDD signal line is coupled to the VSS signal line through the first pad, the width of the first pad in the first direction is 50 µm to 500 µm, e.g., 280 µm. When the first pad is coupled to the other signal line, the width of the first pad in the first direction is 20 µm to 200 µm, e.g., 90 µm.

The quantity of the second pads is 20-1000, e.g., 104, and the width of the second pad in the first direction is 10 µm to 100 µm, e.g., 57 µm.

The first pad is coupled to the electrical test circuitry for the display substrate through a wiring, and then the electrical test circuitry is coupled to the signal line at the display region, so as to detect whether an image is displayed by the display substrate normally. The second pad is coupled to an IC pin (a pin of the driving circuit board) at an input end of the display substrate through a wiring, so as to transmit the signal to the IC bound to the display substrate, and then transmit the signal to the data line at the display region through the IC PIN at an output end so as to display a corresponding image. During the electrical test, merely the probe is lapped onto the first pad for the test, and there is no damage on the first pad. After the test, the first pad is bound to an FPC.

It should be appreciated that, the display substrate here refers to a display substrate to which no driving circuit board is bound to the binding region. Before the binding, the display substrate is detected through the external electrical test circuitry and the first pad, so as to determine whether the display substrate is abnormal. When the display substrate is normal, the circuit board is bound to the display substrate. In this way, it is able to improve the yield of the display substrate.

In some embodiments of the present disclosure, each first pad has two boundaries substantially perpendicular to the second direction, and a shortest distance between the two boundaries is just a length of the first pad in the second direction. Each second pad has two boundaries substantially perpendicular to the second direction, and a shortest distance between the two boundaries is just a length of the second pad in the second direction.

An orthogonal projection of each of the plurality of first pads 031 and the plurality of second pads 032 onto the display substrate is of a rectangular shape, so as to match the probe of the external electrical test circuitry and the pin of the circuit board. When the orthogonal projection is of a rectangular shape, it means that the width of the first pad in the first direction is smaller than the length of the first pad in the second direction, and the width of the second pad in the first direction is smaller than the length of the second pad in the second direction.

Due to the large-size probe, in some embodiments of the present disclosure, the length of each first pad 031 is greater than the length of each of at least a part of the second pads 032 in the second direction, so as to ensure that the first pad 031 is electrically coupled to the probe.

The present disclosure further provides in some embodiments a method for testing the above-mentioned display substrate, which includes applying an electrical test signal to the first pad through the external electrical test circuitry at the panel test stage.

It should be appreciated that, the display substrate here refers to a display substrate to which no driving circuit board is bound to the binding region. Before the binding, the display substrate is detected through the external electrical test circuitry and the first pad, so as to determine whether the display substrate is abnormal. When the display substrate is normal, the circuit board is bound to the display substrate. In this way, it is able to improve the yield of the display substrate.

It should be further appreciated that, the above embodiments have been described in a progressive manner, and the same or similar contents in the embodiments have not been repeated, i.e., each embodiment has merely focused on the difference from the others. Especially, the method embodiments are substantially similar to the product embodiments, and thus have been described in a simple manner.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "one of" are merely used to represent the existence of at least one member, rather than to limit the number thereof. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

It should be appreciated that, in the case that such an element as layer, film, region or substrate is arranged "on" or "under" another element, it may be directly arranged "on" or "under" the other element, or an intermediate element may be arranged therebetween.

In the above description, the features, structures, materials or characteristics may be combined in any embodiment or embodiments in an appropriate manner.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A display substrate, comprising:
a display region and a non-display region at least partially surrounding the display region, the non-display region comprising a binding region;
a plurality of first pads located in the binding region, and configured to be electrically coupled to an external electrical test circuitry at a panel test stage, and bound to a circuit board so as to transmit an electric signal from the circuit board to the display region at a display stage; and
a plurality of second pads located in the binding region, and configured to be bound to the circuit board so as to transmit the electric signal from the circuit board to the display region at the display stage,
wherein the plurality of first pads and the plurality of second pads are arranged side by side in a first direction, and a width of each of the plurality of first pads in the first direction is greater than a width of each of at least a part of the plurality of second pads in the first direction; and
the plurality of first pads comprises a first sub-pad group and a second sub-pad group, the first sub-pad group comprises a plurality of first sub-pads, the second sub-pad group comprises a plurality of second sub-pads, and the plurality of second pads is located between the first sub-pad group and the second sub-pad group.

2. The display substrate according to claim 1, wherein a distance between two adjacent first pads is greater than a distance between two adjacent second pads of at least a part of the second pads in the first direction, and the display region and the binding region are arranged sequentially in a second direction intersecting the first direction.

3. The display substrate according to claim 2, wherein an extension direction of the plurality of first pads and the plurality of second pads is substantially parallel to the second direction.

4. The display substrate according to claim 1, wherein an orthogonal projection of each of the plurality of first pads and the plurality of second pads onto the display substrate is of a rectangular shape.

5. The display substrate according to claim 2, wherein a length of each first pad is greater than a length of each of at least a part of the second pads in the second direction.

6. The display substrate according to claim 1, wherein the plurality of second pads comprises a third sub-pad group, a fourth sub-pad group and a fifth sub-pad group, the third sub-pad group comprises a plurality of third sub-pads, the fourth sub-pad group comprises a plurality of fourth sub-pads, the fifth sub-pad group comprises a plurality of fifth sub-pads, and the fifth sub-pad group is located between the third sub-pad group and the fourth sub-pad group, or the third sub-pad group and the fourth sub-pad group are located between the fifth sub-pads.

7. The display substrate according to claim 6, wherein a width of each of the plurality of third sub-pads and the plurality of fourth sub-pads is greater than a width of each of at least a part of the fifth sub-pads in the first direction.

8. The display substrate according to claim 6, wherein the plurality of third sub-pads and the plurality of fourth sub-pads are configured to be electrically coupled to the external electrical test circuitry at the panel test stage, and bound to the circuit board so as to transmit the electric signal from the circuit board to the display region at the display stage.

9. The display substrate according to claim 1, wherein the display region comprises a first boundary, a second boundary, a third boundary and a fourth boundary arranged in sequence, and the binding region is located at the non-display region close to the fourth boundary,
wherein the display substrate further comprises a first power source line, a first power source pin and a second power source pin, the first power source line is coupled to the first power source pin and the second power source pin, the first power source line extends along the first direction and is located at the non-display region between the display region and the binding region, the first power source pin is located at a side of the plurality of first sub-pads away from the plurality of second pads, and the second power source pin is located at a side of the plurality of second sub-pads away from the plurality of first sub-pads.

10. The display substrate according to claim 9, further comprising a second power source line, a third power source pin and a fourth power source pin, wherein the second power source line is coupled to the third power source pin and the fourth power source pin, the second power source line is located at the non-display region and at least partially surrounds the first boundary, the second boundary and the third boundary, the third power source pin and the fourth power source pin are located at the non-display region close to the fourth boundary, the third power source pin is located at a side of the first power source pin away from the plurality of second pads, and the fourth power source pin is located at a side of the third power source pin away from the plurality of second pads.

11. The display substrate according to claim 10, wherein the first power source pin, the second power source pin, the third power source pin, and the fourth power source pin are configured to be electrically coupled to the external electrical test circuitry at the panel test stage, and bound to the circuit board so as to transmit the electric signal from the circuit board to the display region at the display stage.

12. The display substrate according to claim 10, wherein the plurality of first sub-pads is located between the first power source pin and the third power source pin, and the plurality of second sub-pads is located between the second power source pin and the fourth power source pin.

13. The display substrate according to claim 10, wherein the plurality of first sub-pads is located at a side of the third power source pin away from the first power source pin, and the plurality of second sub-pads is located at a side of the fourth power source pin away from the second power source pin.

14. The display substrate according to claim 10, wherein the first power source line is a positive voltage power source line and the second power source line is a negative voltage power source line.

15. The display substrate according to claim 10, wherein a width of at least one of the first power source pin, the second power source pin, the third power source pin and the fourth power source pin is greater than the width of the plurality of first pads or the plurality of second pads in the first direction.

16. The display substrate according to claim 1, wherein a respective first pad of the plurality of first pads is configured to transmit at least one of a gate driving signal, a multiplexer signal and an electric test signal.

17. The display substrate according to claim 6, wherein a respective third sub-pad of the plurality of third sub-pads and a respective fourth sub-pad of the plurality of fourth sub-pads are configured to transmit a high level signal and a low level signal respectively, and a respective fifth sub-pad of the plurality of fifth sub-pads is configured to transmit a data signal.

18. The display substrate according to claim 1, further comprising a plurality of input pins and a plurality of output pins located between the display region and the plurality of second pads, wherein the plurality of input pins is located at a side of the plurality of output pins away from the display region, the plurality of input pins and the plurality of output pins are configured to be bound to a driver integrated circuit, and the plurality of input pins is coupled to the plurality of second pads through wires.

19. A display device, comprising the display substrate according to claim 1 and a circuit board, wherein the plurality of first pads and the plurality of second pads are bound to the circuit board.

* * * * *